US010700676B2

(12) United States Patent
Tzivanopoulos et al.

(10) Patent No.: US 10,700,676 B2
(45) Date of Patent: Jun. 30, 2020

(54) CIRCUIT ARRANGEMENT FOR PRECHARGING AN INTERMEDIATE CIRCUIT CAPACITANCE OF A HIGH-VOLTAGE ON-BOARD NETWORK

(71) Applicant: Robert Bosch GmbH, Stuttgart (DE)

(72) Inventors: Chrysanthos Tzivanopoulos, Remseck am Neckar (DE); Thomas Kaiser, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/342,564

(22) PCT Filed: Oct. 9, 2017

(86) PCT No.: PCT/EP2017/075589
§ 371 (c)(1),
(2) Date: Apr. 17, 2019

(87) PCT Pub. No.: WO2018/073029
PCT Pub. Date: Apr. 26, 2018

(65) Prior Publication Data
US 2020/0052685 A1    Feb. 13, 2020

(30) Foreign Application Priority Data
Oct. 17, 2016 (DE) .................. 10 2016 220 279

(51) Int. Cl.
*G05F 1/10* (2006.01)
*G05F 1/575* (2006.01)
*H02M 3/04* (2006.01)
*H02M 3/156* (2006.01)
*H03K 17/0412* (2006.01)

(52) U.S. Cl.
CPC ............. *H03K 17/04123* (2013.01); *H03K 2217/0081* (2013.01)

(58) Field of Classification Search
CPC ............. H03K 17/04123; H03K 2217/0081
See application file for complete search history.

(56) References Cited

U.S. PATENT DOCUMENTS 5,859,757 A * 1/1999 Hanafusa ................ G05F 1/575
361/100
6,054,890 A 4/2000 Giacomo
(Continued)

FOREIGN PATENT DOCUMENTS

DE    102008055956    5/2010
DE    102009011244    9/2010
(Continued)

OTHER PUBLICATIONS

International Search Report for Application No. PCT/EP2017/075589 dated Mar. 20, 2018 (English Translation, 4 pages).

*Primary Examiner* — Kenneth B Wells
(74) *Attorney, Agent, or Firm* — Michael Best & Friedrich LLP

(57) ABSTRACT

The present invention relates to a circuit arrangement for switching a high-voltage MOSFET (7) for precharging an intermediate circuit capacitance of a high-voltage on-board network with a first circuit assembly (11), by means of which the switching times of a high-voltage MOSFET used for charging the intermediate circuit capacitance can be reduced.

12 Claims, 4 Drawing Sheets

(56) References Cited

U.S. PATENT DOCUMENTS

| | | | |
|---|---|---|---|
| 6,441,513 | B1 | 8/2002 | Mulhauser |
| 2003/0169024 | A1* | 9/2003 | Cook .................... H02M 3/156 323/268 |
| 2005/0248384 | A1 | 11/2005 | Miettinen |
| 2007/0024124 | A1 | 2/2007 | Zalmanoff |
| 2013/0003428 | A1 | 1/2013 | Meng et al. |
| 2014/0218097 | A1 | 8/2014 | Barrenscheen et al. |
| 2015/0256014 | A1 | 9/2015 | Tzivanopoulos |

FOREIGN PATENT DOCUMENTS

| | | |
|---|---|---|
| DE | 102014101459 | 8/2014 |
| EP | 0496018 | 7/1992 |
| WO | 2016159948 | 10/2016 |

* cited by examiner

CIRCUIT ARRANGEMENT FOR PRECHARGING AN INTERMEDIATE CIRCUIT CAPACITANCE OF A HIGH-VOLTAGE ON-BOARD NETWORK

BACKGROUND OF THE INVENTION

The present invention relates to a circuit arrangement for precharging an intermediate circuit capacitance of a high-voltage on-board power supply system. In particular, the present invention relates to a circuit arrangement that manages with few connections and by means of which the switching times of a high-voltage MOSFET used for charging the intermediate circuit capacitance can be reduced.

The electrification of personal individual transport is currently advancing rapidly. In order to generate the necessary power (very high currents are required at 12 V, which would require copper cables with a cross section that is not sensible in practice), a voltage level (for example 400 volts) that is increased significantly compared to 12-volt on-board power supply systems is conventionally used. The intermediate circuit capacitance transmits energy between an energy store (for example a fuel cell) and one or more electric motors, which is/are used as traction machine/machines. Traction machines are often embodied in a three-phase manner. When the high-voltage on-board power supply system is put into operation, first of all a ground-side contactor is closed, the intermediate circuit capacitance is charged to approximately 99% by means of a limited current and only subsequently is the positive contactor closed. In this way, wear and losses as well as impairments of the function of the positive contactor can be reduced or prevented.

A high-voltage MOSFET is conventionally used for precharging the intermediate circuit capacitance. In order to keep the losses and the development of heat even within the high-voltage MOSFET low, the high-voltage MOSFET has to establish the electrical connection with the lowest possible electrical resistance very quickly. Switching times of below 600 nanoseconds are desirable. The main task of the conventionally used high-voltage MOSFET is to conduct and to switch the precharging current. In order to arrive as quickly as possible at a safe state after the precharging current has been switched off, the switch-off process has to be carried out particularly quickly.

US 2015/0256014 A1 discloses a circuit arrangement for switching a precharging current for a high-voltage on-board power supply system. In a battery control device, first of all a ground contactor then an insulated-gate transistor for actuating a high-voltage MOSFET are closed in order to charge the intermediate circuit capacitance to 99%. The precharging current is limited here by means of an external precharging resistor. The positive battery contactor is then closed.

SUMMARY OF THE INVENTION

It is an object of the present invention to be able to rapidly close and open a high-voltage MOSFET for precharging an intermediate circuit capacitance. In this case, as far as possible, only one actuation signal, which controls the energy transmission and activates/deactivates the high-voltage MOSFET, should be required. The switch-on of the high-voltage MOSFET (time for the switching process of the HV MOSFET) should take place within nanoseconds; the switch-off (that is to say the time between deactivation on the part of the microcontroller and the actual opening of the HV MOSFET) should preferably take place within microseconds.

A rapid switch-on means that the gate-source capacitance is charged as quickly as possible—that is to say the energy is available for the HV MOSFET. Switch-off means that, after the deactivation of the control signal/PWM signal, the energy from the driver stage is reduced as quickly as possible, the MOSFET opens and therefore the safe state is reached.

The aforementioned object is achieved according to the invention by way of a circuit arrangement having a first circuit assembly and configured to turn on the high-voltage MOSFET and to precharge the intermediate circuit capacitance. The first circuit assembly comprises a first input terminal and a second input terminal. The first input terminal can be configured, for example, to be electrically connected to a first output terminal of a transducer of the superordinate circuit arrangement, which is dealt with further below, while the second input terminal of the first circuit assembly is configured to be electrically connected to the second secondary-side output terminal of the transducer. A first and a second current-switched switch and a voltage-switched switch as well as a voltage threshold value transmitter having current limiter (for example designed as a Zener diode) and an ohmic resistor are provided. An output terminal forms the output of the first circuit assembly. A respective first connection of the first current-switched switch, of the voltage-switched switch, of the voltage threshold value transmitter having current limiter and of the ohmic resistor are connected to the first input terminal. From an electrical point of view, the respective first connections form a node, which coincides with the first input terminal. A respective second connection of the first current-switched switch and of the voltage threshold value transmitter having current limiter are connected to a control input of the second current-switched switch. A first connection of the second current-switched switch and a second connection of the ohmic resistor are connected to a control input of the voltage-switched switch. The second connection of the second current-switched switch is connected to the negative connection of the transducer, while a second connection of the voltage-switched switch coincides on one side with the output terminal and on the other side with a control input of the first current-switched switch. The output terminal can be connected to a gate of the high-voltage MOSFET. An electrical energy store (for example in the manner of an additional capacitance) can be connected between the first input terminal and the second input terminal. Said capacitance can be associated with the driver stage and/or with the transducer of the superordinate circuit assembly. In terms of its function for the first circuit assembly, said capacitance provides the energy reserve for shortening the switch-on response.

The dependent claims show preferred development of the invention.

In order to switch off the HV MOSFET, it is advantageous to reduce the energy stored on the capacitor rapidly. To this end, a second circuit assembly is proposed as an optionally preferred expansion (for example likewise as a constituent part of the driver stage of the circuit arrangement). Said second circuit assembly comprises a third input terminal, a first energy store having passive discharge means, a first and second switch, a second output terminal, a third and a fourth output terminal, a second ohmic resistor and a third ohmic resistor. The first energy store is connected to the third input terminal by way of a first connection, in other words electrically connected. Said first energy store is configured to supply electrical energy to a control input of the first switch. A first connection of the first switch and a second connection of the third ohmic resistor are electrically connected to a control connection of the second switch. In other words, the connections thereof form a joint node. First connections of the second and of the third ohmic resistor are connected to the second output terminal, while a second connection of the second ohmic resistor and a first connection of the second switch coincide with one another. Second connections of the first and second switch lie on the fourth output terminal. The third output terminal is electrically connected to the first input terminal and the fourth output terminal is electrically connected to the second input terminal. This circuit ensures discharging of the intermediate circuit capacitance by means of an ohmic resistor arranged in parallel with the additional capacitance. The first energy store of the second circuit assembly is discharged by the passive discharge means, as a result of which the first switch opens. As a result thereof, the second switch closes, as a result of which an additional discharging of the additional capacitance by means of the second ohmic resistor is carried out. The second current-switched switch of the first circuit assembly and the first current-switched switch and the voltage-switched switch of the first circuit assembly open. As a result, the high-voltage MOSFET opens and a precharging current no longer flows into the intermediate circuit capacitance.

It can furthermore be preferred for a diode to be arranged between a source connection of the high-voltage MOSFET and a negative pole of a HV battery. The flow direction of the diode is directed in the direction of the negative pole of the HV battery. This does not exclude further elements in series with the diode being connected to the negative pole of the HV battery. For example, an ohmic resistor can be provided to limit the charging current. The diode, which implements protection against polarity reversal, and the ohmic resistor for current limitation can be arranged in series with the intermediate circuit capacitance.

In order to increase the output-side voltage, which the transducer provides to the driver stage, two transformers whose primary windings are fed by the linear regulator in parallel with one another can be provided in the transducer of the circuit arrangement. In contrast, the secondary windings can be connected in series so that the secondary voltages of the secondary windings are added. Depending on the voltage requirement, three or more transformers can also be arranged in the transducer according to the invention in a corresponding manner, wherein the secondary voltages are all added.

The first circuit assembly, in particular also the second circuit assembly, is preferably integrated in a circuit arrangement for precharging an intermediate circuit capacitance. The circuit arrangement can be provided and designed for use in an electrically drivable means of transportation. Said circuit arrangement comprises a linear regulator, which is configured to decrease an on-board power supply system voltage of a conventional (low) level to an even lower voltage. For example, a 12-volt DC voltage can be decreased to a 7-volt DC voltage. A transducer is configured to convert the electrical energy of the lower voltage to an increased voltage and to supply power to the first and the second circuit assembly presented above, which circuit assemblies are galvanically connected to the high-voltage MOSFET. The transducer can comprise a transformer or a plurality of transformers, but at least a plurality of secondary windings. The transducer can thus cause an efficient voltage increase.

The first circuit assembly and the second circuit assembly can be constituent parts of a driver stage, which is electrically connected on the secondary side to the transducer. The driver stage is configured to actuate the high-voltage MOSFET for switching (switching on/switching off) the intermediate circuit capacitance. The high-voltage MOSFET is configured, for its part, to precharge (for example to approximately 99%) the intermediate circuit capacitance after a ground-side contactor has been closed. The linear regulator provides a lower voltage, which remains stable even in the case of a faulty on-board power supply system and thus feeds the transducer, which is controlled in turn by a pulse-width-modulated (PWM) signal. In this way, an efficient topology for charging an intermediate circuit capacitance that manages with few outer electrical connections is proposed. Moreover, the losses and the wear in the high-voltage MOSFET are kept low.

Using the circuit arrangement of the present invention, energy transmission by way of a DC/DC voltage transducer with galvanic isolation can be provided. To this end, a single-ended forward transducer is preferably provided, of which the coil in the secondary circuit has been replaced by a resistor in the primary circuit. Costs can be saved in this way. The parallel interconnection of two transformers in the primary circuit and the series interconnection of the transformers in the secondary circuit lead to a doubled voltage in the secondary circuit and to an increase in the quantity of the transformers in the overall system, which can also be used in other modules. In the secondary circuit, energy storage takes place by way of capacitors. This makes it possible to switch on the high-voltage MOSFET very quickly since the energy for switching same is stored in capacitors and qualifies the control loop preferably consisting of transistors for rapid switching processes. After the precharging current has been switched off, the high-voltage MOSFET is switched off with a very short delay so that the safe state is reached quickly.

While a precharging relay is used in connection with a precharging resistor in order to precharge the intermediate circuit capacitance in the prior art, the precharging relay can be omitted by using the present invention. This saves costs, installation space and weight.

BRIEF DESCRIPTION OF THE DRAWINGS

Exemplary embodiments of the invention are described in detail below with reference to the appended drawings. In the drawings.

DETAILED DESCRIPTION

Figure 1:
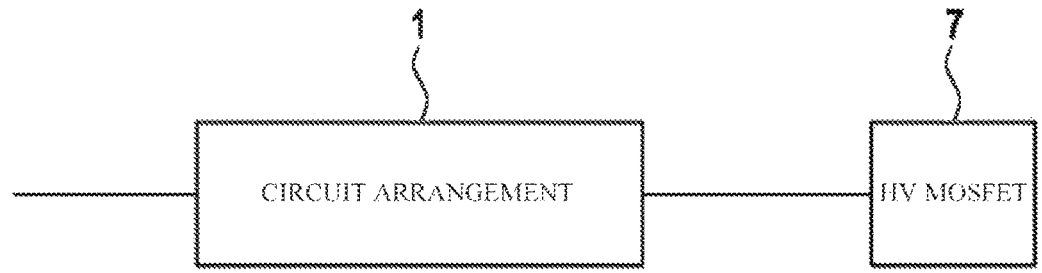
FIG. 1 shows a highly simplified structure diagram illustrating the main signal flow through a circuit arrangement according to an exemplary embodiment of the present invention.

FIG. 1 shows a highly simplified abstraction of a construction according to the invention in which the circuit arrangement 1 is used as a "black box" for actuating a HV MOSFET 7. Only one single input signal feeds the circuit arrangement 1. Only one single output signal is output by the circuit arrangement 1 to the HV MOSFET 7. Accordingly, just one actuation signal controls the energy transmission to the HV MOSFET 7. The same actuation signal activates and deactivates the HV MOSFET 7. The circuit arrangement 1 ensures galvanic isolation of the actuation system with respect to the power components. The switch-on can take place within hundreds of nanoseconds and the switch-off can take place within microseconds, as a result of which switching losses and excessive temperatures are greatly reduced.

Figure 2:
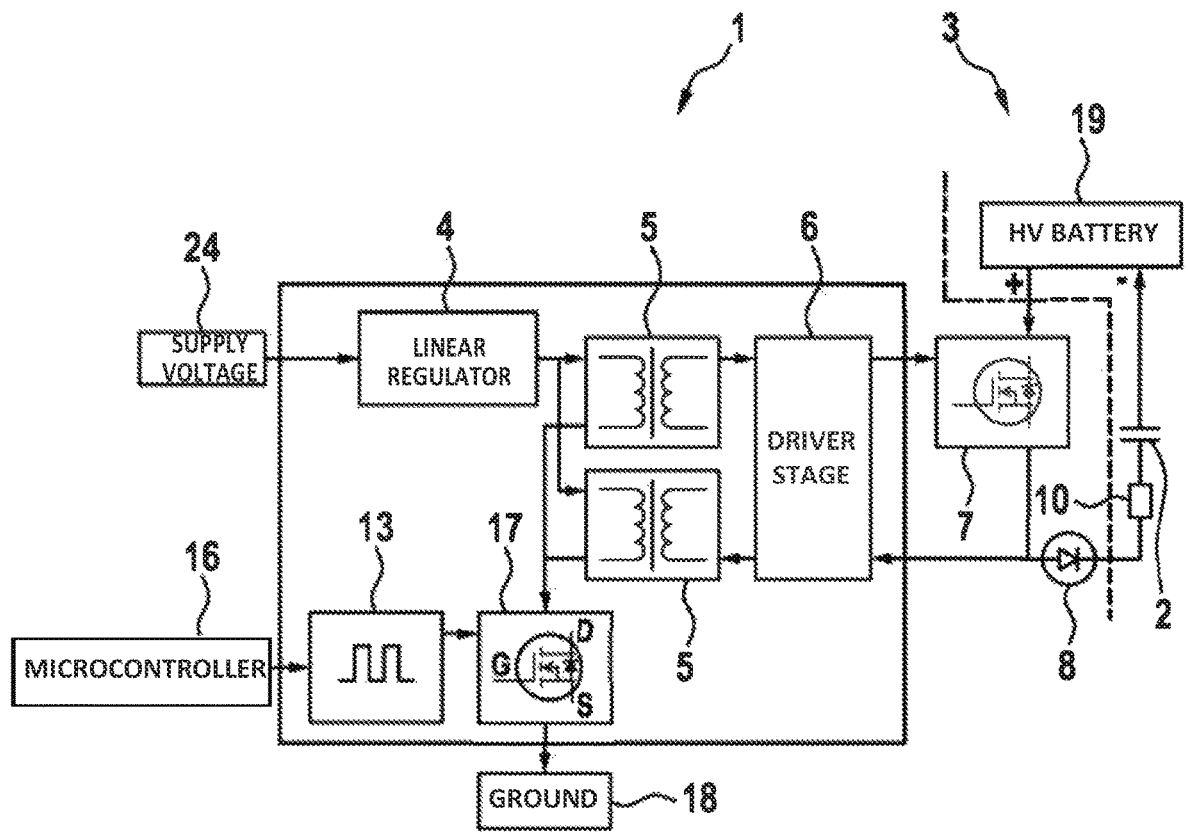
FIG. 2 shows a circuitry overview of an exemplary embodiment of a circuit arrangement according to a further exemplary embodiment of the present invention.

FIG. 2 shows an exemplary embodiment of a circuit arrangement 1 according to the invention, which is fed by means of a supply voltage 24 (12-volt on-board power supply system) and is actuated by a microcontroller 16. The elements of linear regulator 4, transducer 5, driver stage 6, actuation signal 13 and MOSFET 17, which are surrounded by a solid line, represent the functional units of the circuit arrangement 1. The MOSFET 17 is connected to the electrical ground 18. The driver stage 6 is connected to the gate of a high-voltage MOSFET 7, the drain connection of which is fed by means of a HV battery 19. The gate connection of the HV MOSFET 7 is connected to the output terminal according to the claims. The source terminal is connected to the negative pole of the HV battery 19 by way of a series circuit composed of a diode 8, an ohmic resistor 10 (current-limiting resistor) and the intermediate circuit capacitance 2. The high-voltage on-board power supply system 3 is delimited with respect to the circuit arrangement 1 by a dashed line.

Figure 3:
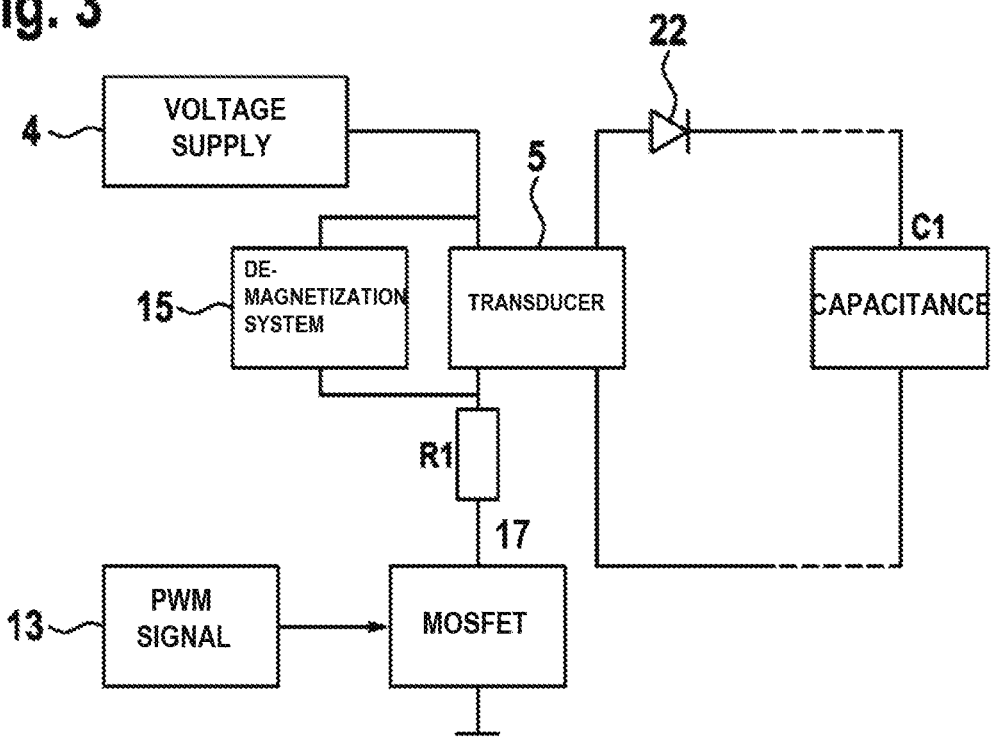
FIG. 3 shows a generic construction of a DC/DC voltage transducer that can be used according to the invention.

FIG. 3 shows a generic construction of a DC/DC voltage transducer, as can be used in the circuit arrangement 1 according to FIG. 1 or 2. The voltage supply 4 feeds the transducer 5, by means of which the decreased on-board power supply system voltage can be transmitted to the additional capacitance C1 in a galvanically isolated manner. A diode 22 prevents the capacitance C1 from being discharged by means of the secondary side of the transducer 5. The transducer 5 is actuated by means of an ohmic resistor R1 and a MOSFET 17, wherein the MOSFET 17 is actuated by means of a PWM signal 13 of 500 kHz and a duty cycle of 20%. On the primary side, the transducer 5 is also connected to the demagnetization system 15. While the MOSFET 17 is thus actuated by the PWM signal 13 (approximately 20% of the operating time), the current flows via the transducer 5 and is limited by R1. In this time, the capacitance C1 is charged—like in the case of the single-ended forward transducer. In the remaining time (approximately 80% of the operating time), the core is demagnetized. On the secondary side, the diode blocks in order to prevent C1 from discharging.

Figure 4:
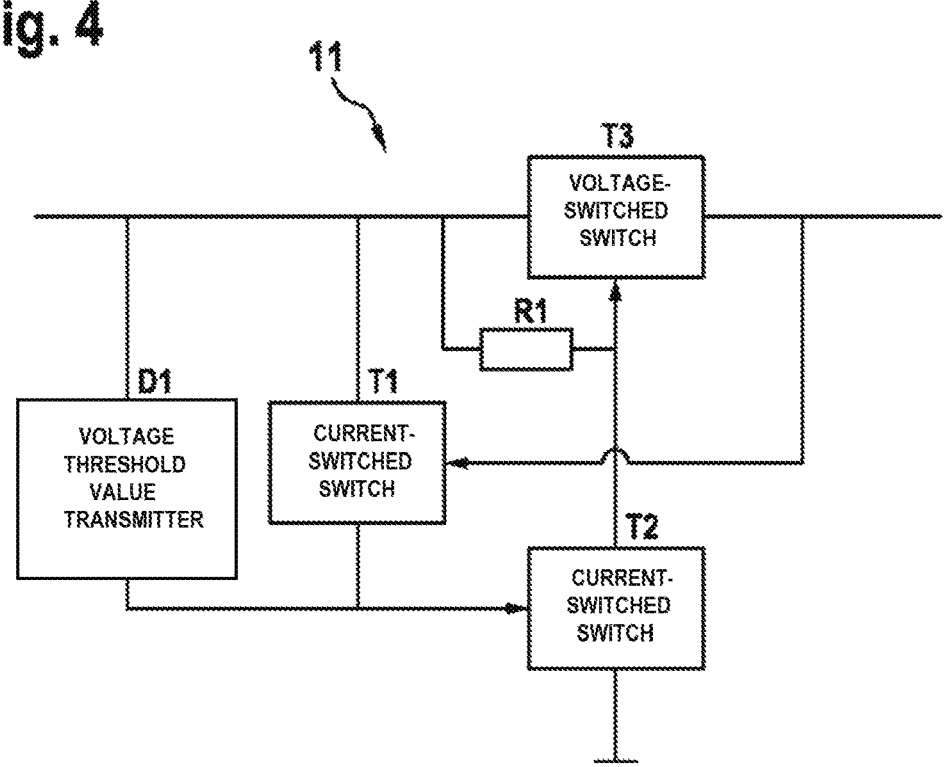
FIG. 4 shows a generic construction of a first circuit assembly for switching the high-voltage MOSFET according to a further exemplary embodiment of the present invention.

FIG. 4 shows a generic construction of a first circuit assembly 11 for accelerating the switch-on response of the HV MOSFET. The HV MOSFET is connected on the output side to the voltage-switched switch T3 (not illustrated in the present case, however). On the input side, a voltage threshold value transmitter D1, having a current limiter, and also a first current-switched switch T1 and an ohmic resistor R1 are connected to the first input terminal. In this case, a first connection of the voltage-switched switch T3 is also connected. Second connections of the voltage threshold value transmitter D1 and of the first current-switched switch T1 are connected to a control input of the second current-switched switch T2. The output of said second current-switched switch is connected to a second connection of the ohmic resistor R1 and to a control connection of the voltage-switched switch T3. The first current-switched switch T1 is actuated by means of the output terminal of the illustrated first circuit assembly. In order to rapidly discharge the capacitance (not illustrated in the present case), which represents the energy store for accelerating the switching process, where necessary and hence to switch off the HV MOSFET with a short delay, an exemplary embodiment of a second circuit assembly is illustrated below.

Figure 5:
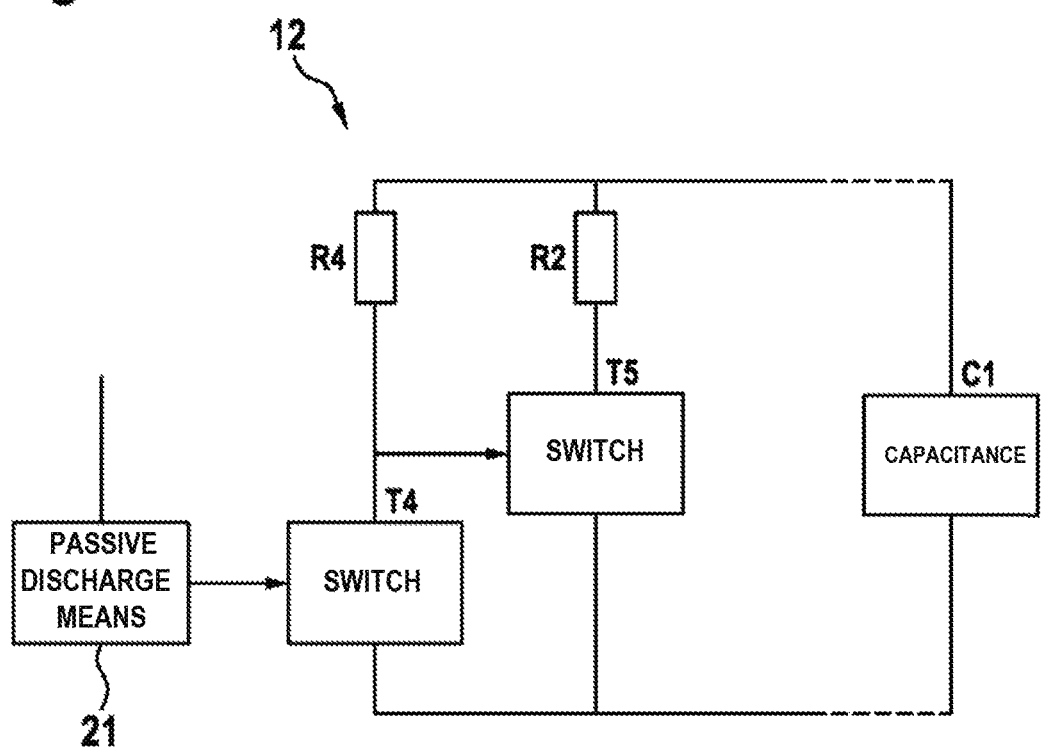
FIG. 5 shows a generic construction of a second circuit assembly for switching off the high-voltage MOSFET according to a further exemplary embodiment of the present invention.

FIG. 5 shows an exemplary embodiment of a second circuit assembly 12, which can ensure switch-off of the HV MOSFET with a short delay in a driver stage 6 of an exemplary embodiment of an arrangement according to the invention. On the input side, a small energy store having a passive discharge means 21 ensures actuation of a first switch T4. A first connection of the first switch T4 is electrically connected to a second connection of a third ohmic resistor R4 and to a control connection of the second switch T5. A respective first connection of the third ohmic resistor R4 and of a second ohmic resistor R2 are connected to a second output terminal. A second connection of the second ohmic resistor R2 and a first connection of the second switch T5 are electrically connected to one another. In this way, the ohmic resistor R2 can rapidly discharge the capacitance C1 when switches T4, T5 are closed and can therefore lead to an acceleration of the switch-off response of the high-voltage MOSFET (not illustrated), which is connected to a circuit assembly (see FIG. 4) for accelerating the switch-on response arranged on the other side of the capacitance C1.

Figure 6:
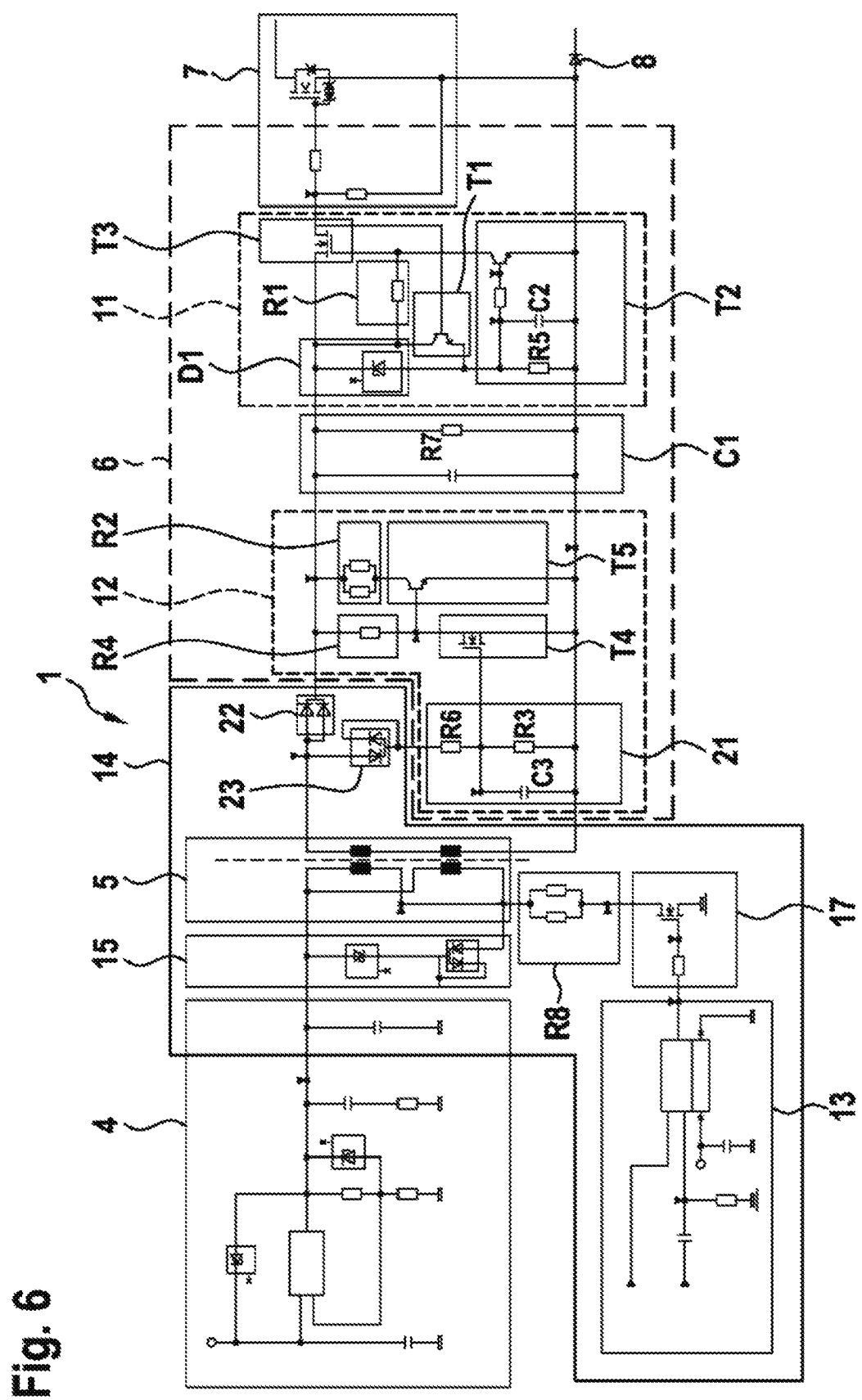
FIG. 6 shows a circuit diagram of a circuit arrangement according to an exemplary embodiment of the present invention, wherein components are illustrated in a grouped manner according to the exemplary embodiments discussed above.

FIG. 6 shows a circuitry option for implementing a circuit arrangement 1 according to the invention in which all of the assemblies contained in the figures discussed above are illustrated and are illustrated with exemplary contents for the circuitry implementation. The components themselves are known to the person skilled in the art, for which reason a detailed explanation can be omitted. The circuit arrangement 1 serves to activate a precharging process of an intermediate circuit capacitance (not illustrated), which can be connected on the output side to the HV MOSFET 7 and the diode 8. This method is carried out after the negative main relay has been closed but before the positive main relay has been closed. The charging current, which is switched by the HV MOSFET 7, is limited by an ohmic series resistor (likewise not illustrated). The rise time of the gate-source voltage of the HV MOSFET 7 has to be limited to below 600 nanoseconds in order to limit the switching losses arising to a sufficient degree. The gate-source voltage of the HV MOSFET 7 is controlled by the converter 14. In addition, the converter 14 having the transducer 5 ensures galvanic isolation between the low-voltage side and the high-voltage side. The linear regulator 4 is configured to generate a stabilized output voltage, which provides the power supply for the illustrated circuit arrangement 1. The converter 14 is actuated by a PWM signal PRCHRG_CTRL. The input signal source 13 represents the actuation system of the switch 17. When the signal ABE_HTO_LEVEL 2 of the input signal source 13 has a high voltage (high-level), the PWM signal activates or deactivates the switch 17. When the switch 17 is closed, a current flows through the transformers arranged in parallel with one another (primary side). Said current is limited by the ohmic resistors R8 arranged in the example in parallel with one another (wherein a single power resistor could also be used). The magnetic flux through the transducer 5 increases with the primary current, as a result of which magnetic energy is stored in the transducer 5. Owing to the series connection of the secondary-side coils of the transducer 5, the voltage here is twice as high as on the primary side. The energy of the transducer 5 is transmitted to the secondary side, in response to which a current flows through the diode pairs 22, 23. When the switch 17 opens, the current and hence the energy remaining in the transducer 5 is driven through the demagnetization assembly 15 and the freewheeling diode thereof. This results in a negative voltage on the secondary side. However, a corresponding flow of current on the secondary side is blocked by the diodes 22 and 23.

When the HV MOSFET 7 is turned on, a current is provided by the converter 14, the energy of which charges the capacitances C1 and C3 by means of the transducer 5, wherein the ohmic resistor R6 limits the flow of current into the capacitor C3. This causes the first switch T4 to close (wherein the ohmic resistor R4 limits the current) and the second switch T5 to open. The capacitance C1 (with self-discharging via the ohmic resistor R7), which represents the main energy store of the driver stage 6, is charged with each switching process of the PWM signal on the primary side. As soon as the breakdown voltage of the diode D1 is reached, the capacitance C2 of the second current-switched switch T2 is charged. The second current-switched switch T2 then closes, whereupon a current flows through the ohmic resistor R1 and the voltage-switched switch T3 likewise closes. This is followed by the activation of the first current-switched switch T1, as a result of which the base-emitter voltage at the second current-switched switch T2 is stabilized. In this case, the second current-switched switch T2 reaches saturation and accordingly the voltage-switched switch T3 does too. This leads to a high current from the capacitance C1 which immediately charges the gate capacitance of the HV MOSFET 7. This leads to a rapid turn-on of the HV MOSFET.

Upon switch-off, the capacitance C1 is discharged slowly by the ohmic resistor R7. The capacitance C2 is discharged slowly by the ohmic resistor R5. The capacitance C3 is discharged by the ohmic resistor R3, whereupon the first switch T4 opens. This leads to a high potential at the base of the second switch T5. As soon as the second switch T5 closes, the capacitance C1 is discharged by the parallel low-impedance resistors R2 (there could also be one single power resistor). The base-emitter voltage at the second current-switched switch T2 drops, whereupon the first current-switched switch T1, the second current-switched switch T2 and the voltage-switched switch T3 open. The HV MOSFET 7 then opens and no further precharging current flows into the intermediate circuit capacitance.

The invention claimed is:

1. A circuit arrangement for switching a high-voltage MOSFET (7) for precharging an intermediate circuit capacitance (2) of a high-voltage on-board power supply system (3), the circuit arrangement including a first circuit assembly, the first circuit assembly comprising:
   a first input terminal;
   a first current-switched switch (T1);
   a second current-switched switch (T2);
   a voltage-switched switch (T3);
   a voltage threshold value transmitter (D1) including a current limiter;
   an ohmic resistor (R1);
   a transducer that has two transformers connected in parallel on a primary side and in series on a secondary side; and
   an output terminal,
   wherein the first current-switched switch (T1), the voltage-switched switch (T3), the voltage threshold value transmitter (D1), and the ohmic resistor (R1) are connected to the first input terminal and the first current-switched switch (T1) and the voltage threshold value transmitter (D1) are connected to a control input of the second current-switched switch (T2) and wherein a first connection of the second current-switched switch (T2) and
   a second connection of the ohmic resistor (R1) is connected to a control input of the voltage-switched switch (T3), a second connection of the second current-switched switch (T2) is connected to an electrical ground,
   the voltage-switched switch (T3) is connected on one side to the output terminal and is coupled, at the one side, to a control input of the first current-switched switch (T1), and the voltage-switched switch (T3) is connected on a second side to the first input terminal and to the first current-switched switch (T1), and a control input.

2. The circuit arrangement as claimed in claim 1, wherein the output terminal is connected to a gate of the high-voltage MOSFET.

3. The circuit arrangement as claimed in claim 1, wherein a capacitance (C1) is connected between the first input terminal and the electrical ground.

4. The circuit arrangement as claimed in claim 1, further comprising a second circuit assembly (12), the second circuit assembly comprising:
   a third input terminal,
   a first energy store (C3) including a passive discharge means (R3),
   a first switch (T4),
   a second switch (T5),
   a second output terminal,
   a third and a fourth output terminal,
   a second ohmic resistor (R2) and
   a third ohmic resistor (R4),
   wherein the first energy store (C3) is connected to the third input terminal and is configured to supply energy to a control input of the first switch (T4), the first switch (T4) and the third ohmic resistor (R4) are connected to a control connection of the second switch (T5), a first connection of the second ohmic resistor (R2) and the third ohmic resistor (R4) is connected to the second output terminal, a second connection of the second ohmic resistor (R2) is connected to the second switch (T5), and a second input of the first switch (T4) and the second switch (T5) is connected to the fourth output terminal, and
   wherein the third output terminal is connected to the first input terminal and the fourth output terminal is connected to the electrical ground.

5. The circuit arrangement as claimed in claim 1, the circuit arrangement further comprising a linear regulator (4) and wherein the linear regulator (4) is configured to decrease a 12 V battery voltage to a lower voltage and the transducer (5) is configured to convert electrical energy of the lower voltage for actuating a driver stage (6) to an increased voltage and to undertake galvanic isolation.

6. The circuit arrangement as claimed in claim 1, the circuit arrangement further comprising a diode (8) between a source connection of the high-voltage MOSFET (7) and a negative pole of a HV battery, the diode (8) configured to charge the intermediate circuit capacitance (2) in a flow direction toward the negative pole.

7. The circuit arrangement as claimed in claim 6, wherein the diode (8) is arranged in series with the intermediate circuit capacitance (2).

8. The circuit arrangement as claimed in claim 6, further comprising a second ohmic resistor (10) in series with the diode (8).

9. The circuit arrangement as claimed in claim 1, the circuit arrangement further comprising a negative contactor and a positive contactor, wherein the transducer (5) is further configured to close the high-voltage MOSFET (7) after the negative contactor has been closed and before the positive contactor has been closed to close the high-voltage MOSFET (7).

10. The circuit arrangement as claimed in claim 1, wherein the circuit arrangement (1) is configured to actuate the transducer via a PWM signal.

11. The circuit arrangement as claimed in claim 1, wherein a second ohmic resistor (R7) is connected between the first input terminal and the electrical ground.

12. The circuit arrangement as claimed in claim 1, wherein a capacitance (C1) and a second ohmic resistor (R7) are connected between the first input terminal and the electrical ground.

* * * * *